United States Patent
Brown et al.

(10) Patent No.: US 6,191,458 B1
(45) Date of Patent: Feb. 20, 2001

(54) SILICON CARBIDE INTEGRATED CIRCUITS

(75) Inventors: Dale Marius Brown, Schenectady; Gerald John Michon, Waterford; Vikram Bidare Krishnamurthy, Latham; James William Kretchmer, Ballston Spa, all of NY (US)

(73) Assignee: General Electric Company, Schenectady, NY (US)

(*) Notice: Under 35 U.S.C. 154(b), the term of this patent shall be extended for 1306 days.

(21) Appl. No.: 08/614,920

(22) Filed: Mar. 11, 1996

Related U.S. Application Data

(63) Continuation of application No. 08/493,056, filed on Jun. 21, 1995, now abandoned, which is a continuation of application No. 08/300,255, filed on Sep. 2, 1994, now abandoned, which is a division of application No. 08/201,494, filed on Feb. 24, 1994, now Pat. No. 5,385,855.

(51) Int. Cl.[7] .......................... H01L 29/76; H01L 29/94; H01L 31/062
(52) U.S. Cl. ............................ 257/379; 257/402; 257/77
(58) Field of Search ................................. 257/379, 402, 257/77

(56) References Cited

U.S. PATENT DOCUMENTS 5,165,283 * 11/1992 Kurtz et al. ............................ 73/727
5,326,991 * 7/1994 Takasu ................................... 257/17

FOREIGN PATENT DOCUMENTS

2756915 * 7/1978 (DE) ..................................... 257/402
2-7474 * 1/1990 (JP) ..................................... 257/379

OTHER PUBLICATIONS

Sedra et al, *Microelectronic Circuits*, p. 796, 1982.*
Article Entitled "GE Fabricates OP AMP in SiC", Solid State Technology, Jul. 1994, p. 36.
Article Entitled "GE Fabricates Silicon–Carbide ICS", Machine Design, Jul. 25, 1994, p. 26.
Article Entitled "High–Temp Silicon Subtitute? Monolithic SiC Beats the Heat", Electronic Engineering Times, Jun. 13, 1994, 2 pages.
"Silicon Carbide Takes the Heat" by Richard Piellisch, Aerospace America, Oct. 1994, pp. 28–37.

(List continued on next page.)

Primary Examiner—Stephen D. Meier
(74) Attorney, Agent, or Firm—Ann M. Agosti; Jill M. Breedlove

(57) ABSTRACT

A depletion mode MOSFET and resistor are fabricated as a silicon carbide (SiC) integrated circuit (IC). The SiC IC includes a first SiC layer doped to a first conductivity type and a second SiC layer overlaid on the first SiC layer and doped to a second conductivity type. The second SiC layer includes at least four more heavily doped regions of the second conductivity type, with two of such regions comprising MOSFET source and drain electrodes and two other of such regions comprising resistor electrodes. The second SiC layer includes an isolation trench between the MOSFET electrodes and the resistor electrodes. At least two electrically conductive contacts are provided as MOSFET electrode contacts, each being positioned over at least a portion of a respective MOSFET electrode and two other electrically conductive contacts are provided as resistor electrode contacts, each being positioned over at least a portion of a respective resistor electrode. An oxide layer extends over the second SiC layer with at least a portion of the oxide layer positioned between the MOSFET electrode contacts. A MOSFET gate electrode is positioned over the oxide layer, and coupling means are provided for electrically coupling one of the source, drain, and gate electrodes to one of the resistor electrodes.

17 Claims, 17 Drawing Sheets

OTHER PUBLICATIONS

Article Entitled "GE Makes SiC Sensors That Can Take the Heat", Chemical Week, May 25, 1994, p. 57.

Article Entitled "Silicon Carbide Makes the Grade for High–Temperature Sensors", Chemical Engineering, Jun. 1994, p. 19.

Article Entitled "GE Fabricates High Temperature ICS", Surface Modification Technology News, Sep. 1994, 1 page.

Article Entitled "Silicon Carbide ICS Now Easier to Produce", Defense Electronics, Sep. 1994 1 page.

Article Entitled Shifting Tides, Performance Materials, May 30, 1994, 1 page.

"High Temperature Silicon Carbide Planar IC Technology and First Monolithic Silicon Carbide Operational Amplifier IC" by Dale M. Brown, et al, Second International High Temperature Electronics Conference, Jun. 1994, pp. 1–6.

* cited by examiner

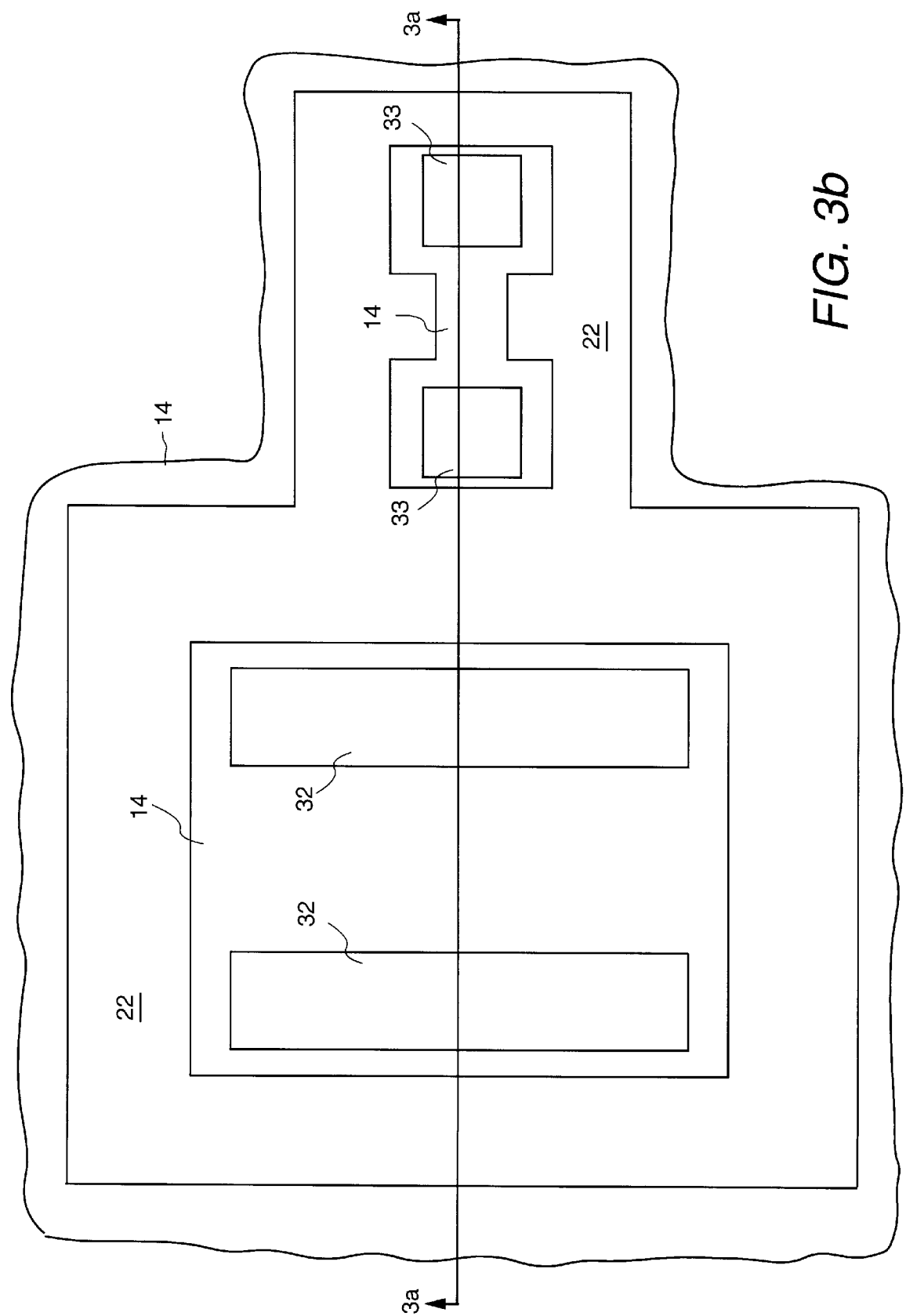

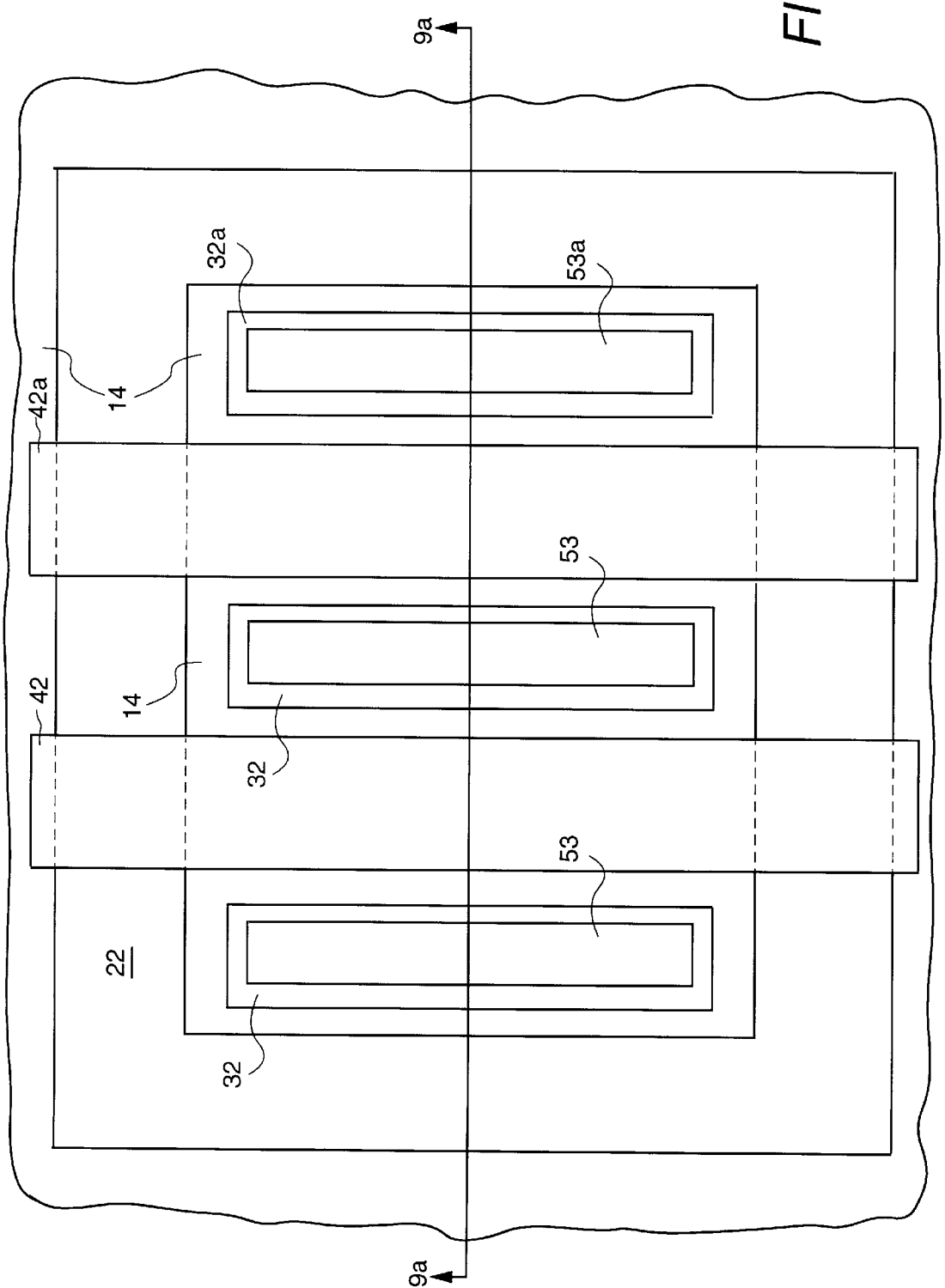

SILICON CARBIDE INTEGRATED CIRCUITS

This application is a Continuation of application Ser. No. 08/493,056 filed Jun. 21, 1995 now abandoned which is a FWC of 08/300,255 (RD-24478) filed Sep. 2, 1994, now abandoned, which is a Division of 08/201,494 (RD-23460) filed Feb. 24, 1994 which issued as U.S. Pat. No. 5,385,855.

This invention was made with Government support under Government Contract No. F33615-90-C-1494 awarded by the Air Force. The Government has certain rights in this invention.

BACKGROUND OF THE INVENTION

1. Field of the Invention

This invention relates generally to Integrated circuits, and, more particularly, to fabrication of integrated circuits with silicon carbide semiconductor material.

2. Description of the Related Art

Conventional integrated circuits have not been fabricated of silicon carbide (SiC) semiconductor materials. The use of SiC material in an integrated circuit (IC), however, would have a number of advantages. SiC material has a large bandgap of about three electron volts which provides a very low leakage current and thus would allow IC operation at very high temperatures (up to about 500° C.). Additionally, the thermal conductivity of SiC is much higher than silicon, so higher power densities could be accommodated with SiC circuits. Furthermore, the carrier saturation velocity of SiC is high (about twice as high as that of gallium arsenide), a factor which would allow construction of very high speed circuits when micron and sub-micron geometries are used.

SUMMARY OF THE INVENTION

Accordingly, an object of the present invention is to provide silicon carbide (SiC) integrated circuits (ICs) for a wide variety of applications, and a method of fabricating such circuits.

Another object of the present invention is to provide a SiC IC capable of amplifying low-level currents, such as those conducted in ultraviolet SiC photodetectors, and to achieve high gain with high reliability at high temperatures.

Another object is to provide an operational amplifier fabricated entirely as a SiC integrated circuit.

The foregoing objects are achieved, in part, by providing a SiC IC fabricated with depletion mode refractory metal metal-oxide-semiconductor field-effect transistors (MOSFETs) and resistors in the same thin SiC semiconductor layer of n type conductivity. A depletion mode MOSFET is used instead of an enhancement mode MOSFET because enhancement mode MOSFETs can exhibit poor reliability at high temperatures in SiC. An underlying SiC layer of p type conductivity can be used for turning the device off and for providing the proper back gate transconductance for integrated circuit applications. Isolation between devices is presently achieved by etching moats through the n type layer. Junction isolation with p type ion implantation could also be used. These MOSFETs and resistors can be interconnected in a wide variety of integrated circuits.

The resistors in the present invention of the SiC IC are fabricated differently than resistors in a silicon IC for the purpose of obtaining a substantially constant gain. When silicon is used, the resistors typically comprise polysilicon material overlying an oxide layer. Polysilicon load resistors exhibit a negative temperature coefficient. Typically polysilicon resistor values are reduced by a factor of three when the temperature is increased from 0° C. to 350° C. SiC MOSFET charge carrier mobility drops by a factor of two over the same temperature increase, which would result in a six-fold gain reduction. Thus a resistor which has a resistance value which increases with increasing temperature is required for offsetting the corresponding decrease in charge carrier mobility.

More specifically, according to a preferred embodiment of the invention, a silicon carbide (SiC) integrated circuit (IC) includes a first SiC layer doped to a first conductivity type overlaid with a second SiC layer doped to a second conductivity type. The second SiC layer has at least four regions more heavily doped to the second conductivity type than the remainder of that layer, with two of the higher doped regions comprising MOSFET electrodes and two of the higher doped regions comprising resistor electrodes. The second SiC layer has an isolation region between the MOSFET electrodes and the resistor electrodes. An oxide layer extends over the second SiC layer with at least a portion of the oxide layer positioned over a portion of the second SiC layer which is between the two MOSFET electrodes. One of the MOSFET electrodes comprises a source electrode and the other of the MOSFET electrodes comprises a drain electrode. A gate electrode is positioned over the oxide layer so as to overlie the portion of the second SiC layer between the two MOSFET electrodes, and coupling means are provided for electrically coupling one of the gate, source, and drain electrodes to one of the resistor electrodes.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIGS. 9a–9b are respective sectional side and top views similar to those of FIGS. 8a–8b wherein the SiC IC includes two MOSFETs having a common source electrode;

DETAILED DESCRIPTION OF A PREFERRED EMBODIMENT OF THE INVENTION

Figure 1A:
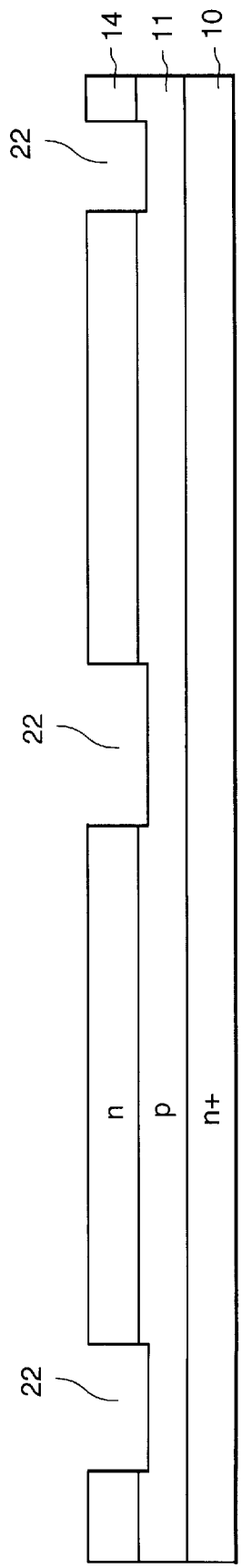
FIGS. 1a–8b are views of steps in a process for forming a silicon carbide (SiC) integrated circuit (IC) including a MOSFET and a resistor.

FIGS. 1a–8b are views of steps in a process for forming a silicon carbide (SiC) integrated circuit (IC) including a MOSFET and a resistor. FIG. 1a is a sectional side view of a SiC substrate 10, supporting first and second SiC layers 11 and 14, respectively. In one embodiment, SiC substrate 10 has a thickness of about 250 μm and comprises 6H-SiC of n+ type conductivity with a concentration of $1 \times 10^{18}$ atoms/$cm^3$. (SiC substrate 10 can alternatively be of p type conductivity, as shown in FIGS. 9a–9b). SiC layer 11 is of p type conductivity and can be formed on substrate 10 by epitaxial deposition, for example. SiC layer 14 is of n type conductivity and can be formed on p type SiC layer 11 by epitaxial deposition. Preferred concentrations and thickness of p type layer 11 and n type layer 14 are discussed below.

Any appropriate method can be used to form isolation regions 22 in n type layer 14. In one embodiment, in which physical trenches form isolation regions, a buffer oxide layer (not shown) comprising silicon dioxide is deposited or thermally grown to a thickness of 300 Å on n type layer 14; a mask layer (not shown) comprising aluminum is sputtered to a thickness of about 2000 Å on the buffer layer; the mask layer and buffer layer are patterned using photoresist (not shown); a reactive ion etch process is used to etch through the patterned mask and form trenches 22 through layer 14 to form islands (devices regions) of layer 14; and the photoresist, mask layer, and buffer layer are then removed.

Figure 1B:
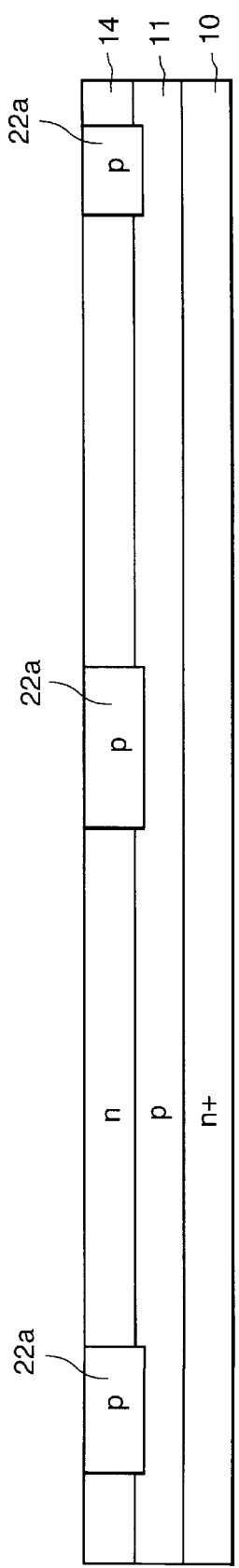

Other methods for forming isolation regions could include the process of implanting p type ions in n type layer 14 to form p type regions 22a, as shown in FIG. 1b in layer 14 for junction isolation and the process of using a silicon nitride oxidation mask for selectively growing silicon dioxide in layer 14. Typically each circuit device is surrounded by an isolation region, and adjacent devices can share a common isolation region between them.

Figure 2:
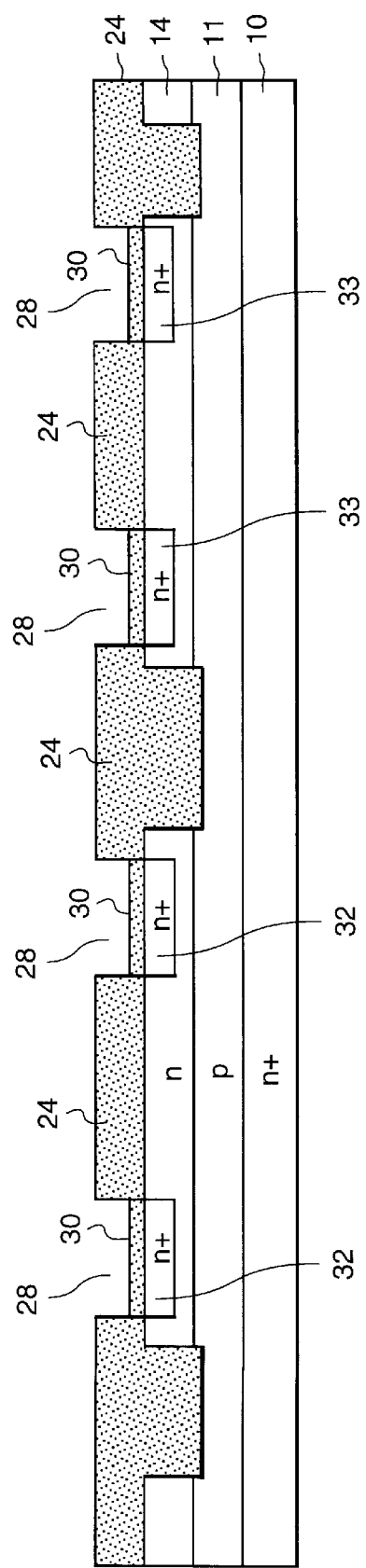

FIG. 2 is a sectional side view of a step for forming implant regions of a resistor and a depletion mode MOSFET. A thick high temperature patterning oxide layer 24, comprising silicon dioxide having a thickness of about 10,000 Å, for example, is chemical vapor deposited at a temperature of about 800° C. over n type layer 14 and then annealed at a temperature of about 1200° C. for sixty minutes so that the oxide material is capable of resisting the in-situ high temperatures which occur during the subsequent nitrogen implantation process. Next the patterning oxide layer is patterned, using photoresist (not shown), for example, to leave openings 28. Then a further thickness of oxide is grown or deposited in openings 28 (shown as thin oxide layer 30) comprising silicon dioxide having a thickness of about 300 Å, for example, to keep implanted ions close to the surface and reduce contact resistance.

Figure 3A:
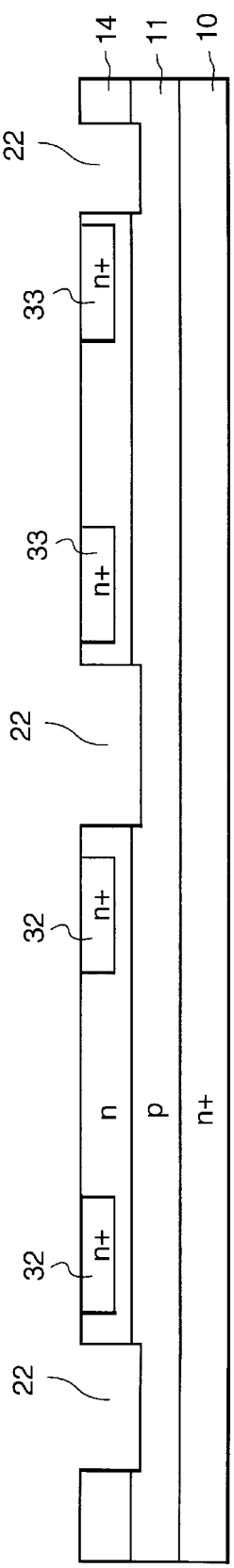

Nitrogen is ion implanted into at least four regions of n type layer 14 through openings 28, shown as MOSFET electrodes 32 (source and drain electrodes) and resistor electrodes 33, both of which then become higher doped n+ type conductivity regions. The implantation, performed at a temperature of about 1000° C., results in electrodes 32 and 33 each having a thickness of about 3000 Å. The energy used for supplying the dopant through the patterning oxide openings must be varied so that the dopant is uniformly dispersed throughout the desired volume. A multiple implant sequence having various doses and energies is needed to create a box profile because, unlike silicon, it is difficult to use heating to cause ions to diffuse to a desired depth in SiC. Implant Science Corp., Wakefield, Mass., markets a computer program, known as "Profile," for SiC implantation which can model the proper doses and energies for the desired application. After implantation, the SiC layers are held at about 1300° C. for 30 minutes in a resistively heated ceramic sintering furnace. The implantation process is further discussed in M. Ghezzo et al., "Nitrogen-implanted SiC Diodes Using High Temperature Implantation," IEEE Electron Device Letters 13, December 1992, pp. 639–641. After the n+ type regions have been formed and the SiC device has been removed from the furnace, the patterning oxide is removed by a wet etch in buffered hydrofluoric acid, to result in the structure shown in FIG. 3a. FIG. 3b is a top view of one embodiment of the structure shown in FIG. 3a.

Figure 4:
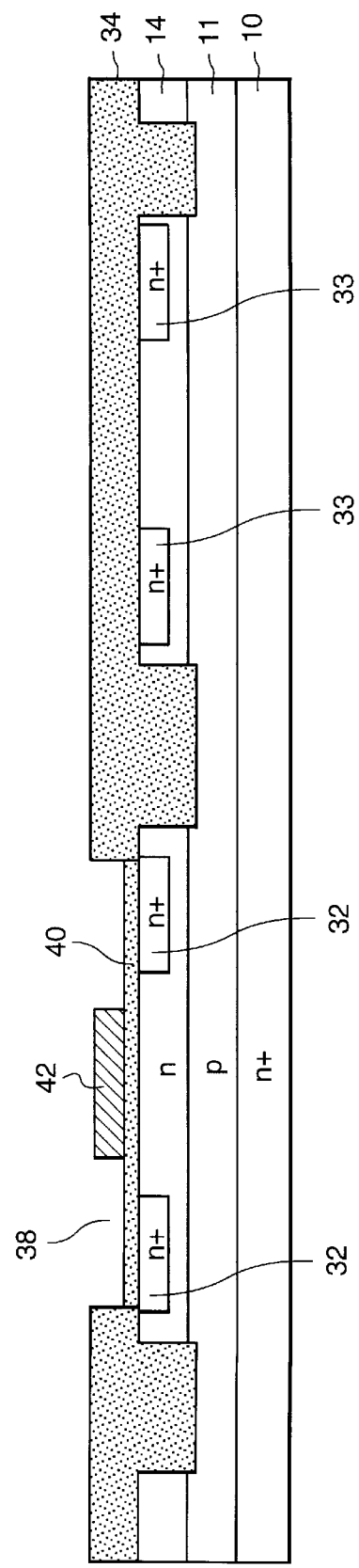

Next, as shown in FIG. 4, a first oxide layer 34 is applied over the entire device. In one embodiment oxide layer 34 is formed by growing a thin layer of silicon dioxide to a thickness of about 300 Å at a temperature of about 1100° C. and then depositing a silicon dioxide layer with a thickness of about 4500 Å. Oxide layer 34 is annealed at 1200° C. for 60 minutes in nitrogen and then patterned with photoresist (not shown) to form an opening 38 in the oxide layer 34 over MOSFET electrodes 32 of n type layer 14 and the portion of n type layer 14 between MOSFET electrodes 32. In a linear gate device, opening 38 must extend at least to the edge of the n type layer 14 over which the ends of the gate electrode will subsequently overlie (gate electrode overlying n type layer shown in FIGS. 8b and 9b). Then a further thickness of oxide is grown on oxide layer 34 and the exposed portion of n type layer 14 (as shown by thermal oxide layer 40) to a thickness of about 500 Å, and a gate electrode 42 is formed by applying and patterning, on oxide layer 40, an electrically conductive layer such as doped polysilicon or sputtered molybdenum with a thickness of 6000 Å. Preferably, gate electrode 42 extends over trench 22, as shown in FIG. 8b, to prevent current from flowing around the ends of the gate.

A MOSFET substrate contact to the p type layer 11 can be formed on the bottom surface of substrate 10 if a p+ type substrate is used, as shown in FIG. 9a. If an n type substrate is used, as shown in FIGS. 1a–8b, then, because contact metallurgy varies with contact type, contacts to p type layer 11 and contacts to n type layer 14 are formed in separate steps.

Figure 5A:
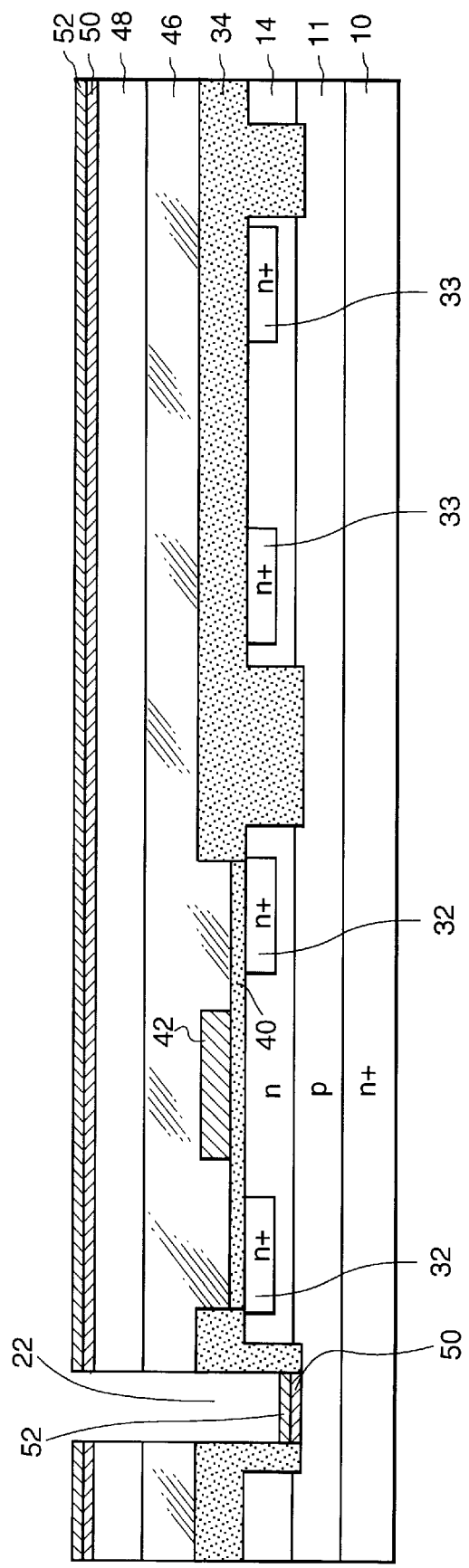
Figure 5B:
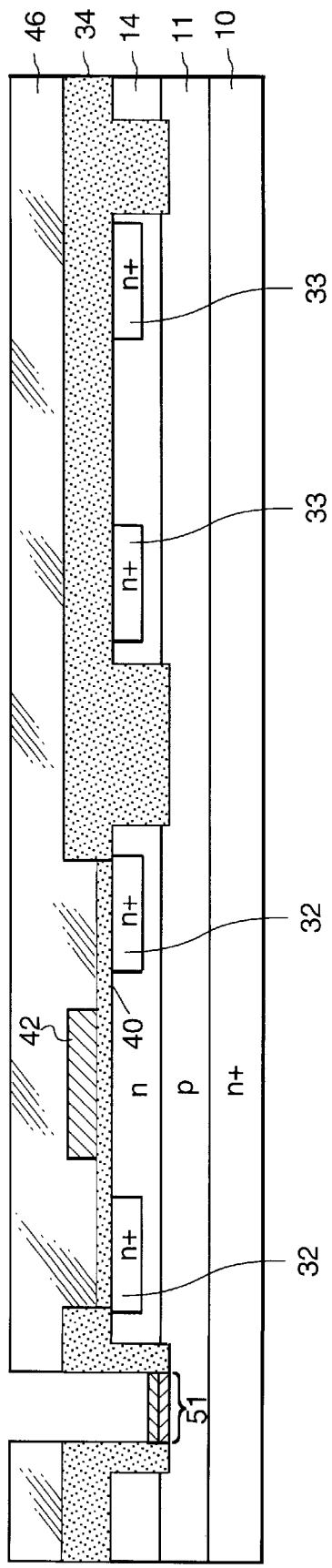

In one embodiment for fabricating a substrate contact 51 to p type layer 11, as shown in FIG. 5a, a dielectric layer 46 comprising, for example, phosphosilicate glass, is chemical vapor deposited over the structure shown in FIG. 4 at a temperature of about 450° C. and annealed in nitrogen at a temperature of 925° C. for 30 minutes. A layer of photoresist 48 is applied and patterned over dielectric layer 46, and dielectric layer 46 and oxide layer 34 are etched to leave a well exposing a portion of trench 22. Then photoresist layer 48 and the exposed surface of p type layer 11 in the trench is metallized with, for example, aluminum 50 at a thickness of about 1700 Å and titanium 52 at a thickness of about 600 Å. As shown in FIG. 5b, photoresist layer 48 and the overlapping portions of aluminum material 50 and titanium material 52 are then lifted from the assembly, leaving aluminum and titanium in the trench as substrate contact 51.

Figure 6A:
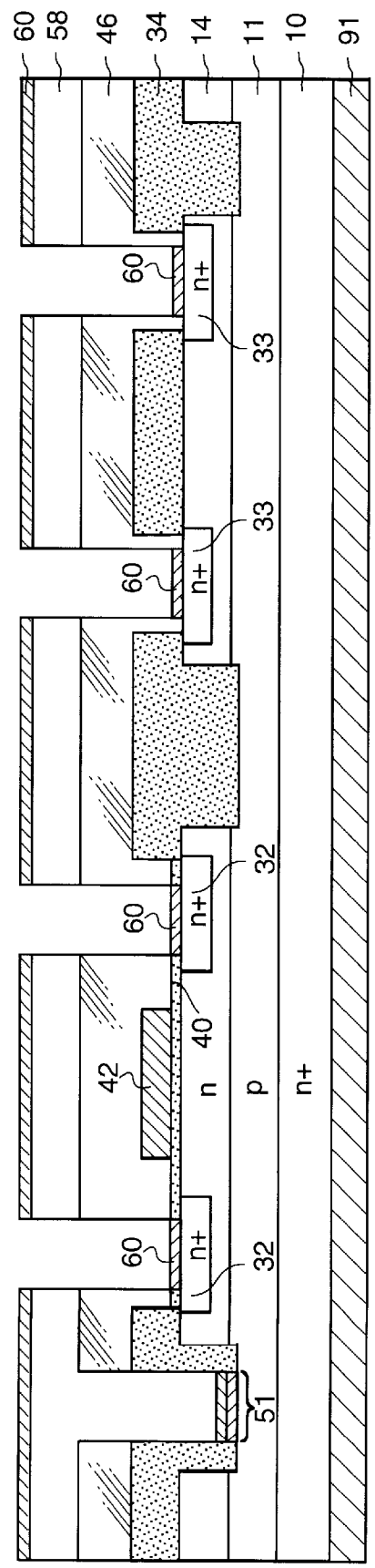

As shown in FIG. 6a, a layer of photoresist 58 is next applied and patterned for etching openings in dielectric layer 46 at least partially aligned with portions of n+ type regions 32 and 33. The layer of photoresist and the n+ type regions are then covered with contact material 60 which, in one embodiment, comprises a 550 Å thickness of sputtered nickel. The backside of substrate 10, when an n+ type substrate is used, can be metallized with a layer comprising a material such as nickel 91.

Figure 6B:
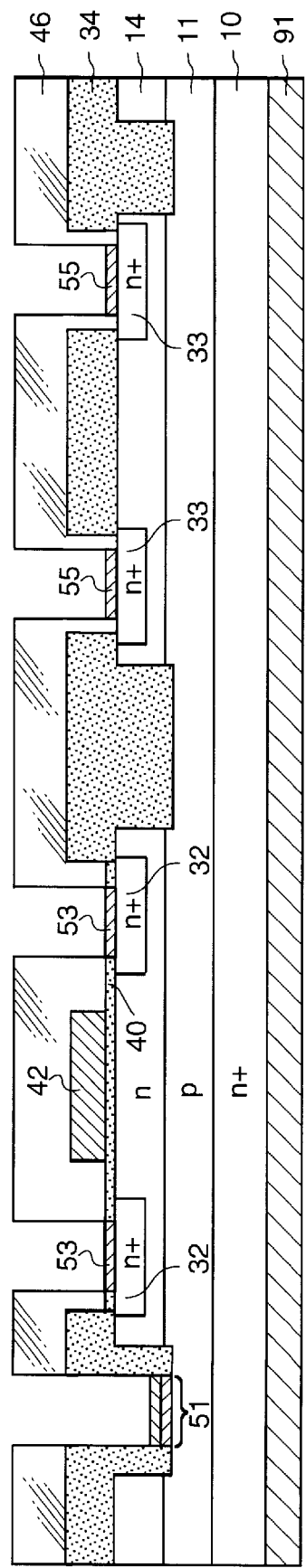

As shown in FIG. 6b, photoresist layer 58 and overlying contact material 60 are thereafter lifted off, leaving contact material over n+ type regions 32 and 33 to form MOSFET electrode contacts 53 and resistor electrode contacts 55. The assembly is then annealed in argon for 2 minutes at a temperature of 925° C.

Figure 7:
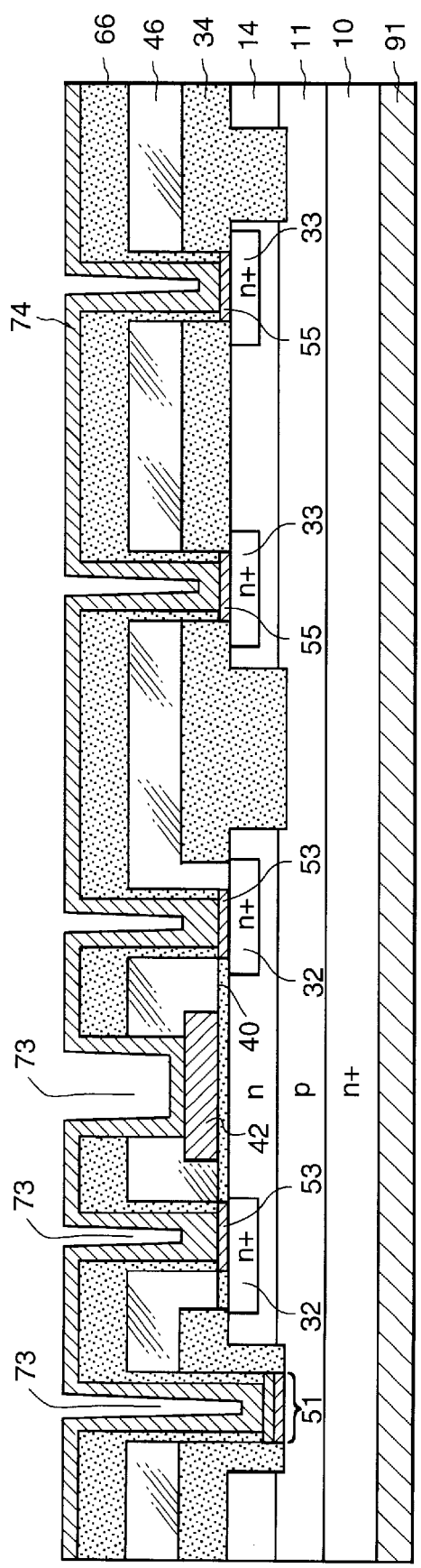

A second oxide layer 66 comprising, for example, silicon dioxide having a thickness in one embodiment of 3000 Å, is then applied, as shown in FIG. 7, using chemical vapor deposition at a temperature of about 400° C., for example, and patterned with photoresist (not shown) to provide openings 73 at least partially aligned with the gate electrode and the substrate, MOSFET, and resistor electrode contacts. Second oxide layer 66 preferably encapsulates dielectric layer 46, and is subsequently used to confine the interconnect contact openings to be within the edges of the contact metal. A layer of electrically conductive interconnection material 74 is then applied over the entire device, including openings 73, and in one embodiment comprises a 2000 Å thickness of sputtered titanium and a 6000 Å thickness of sputtered molybdenum.

Figure 8A:
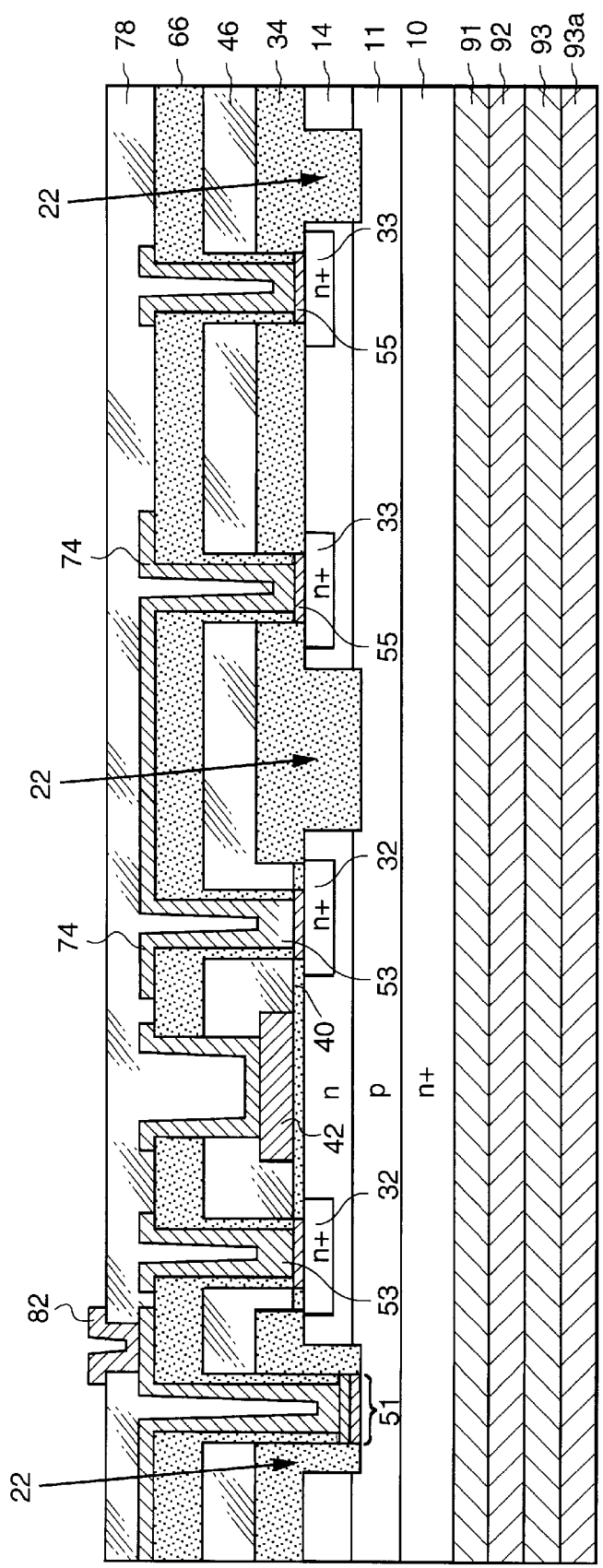
Figure 8B:
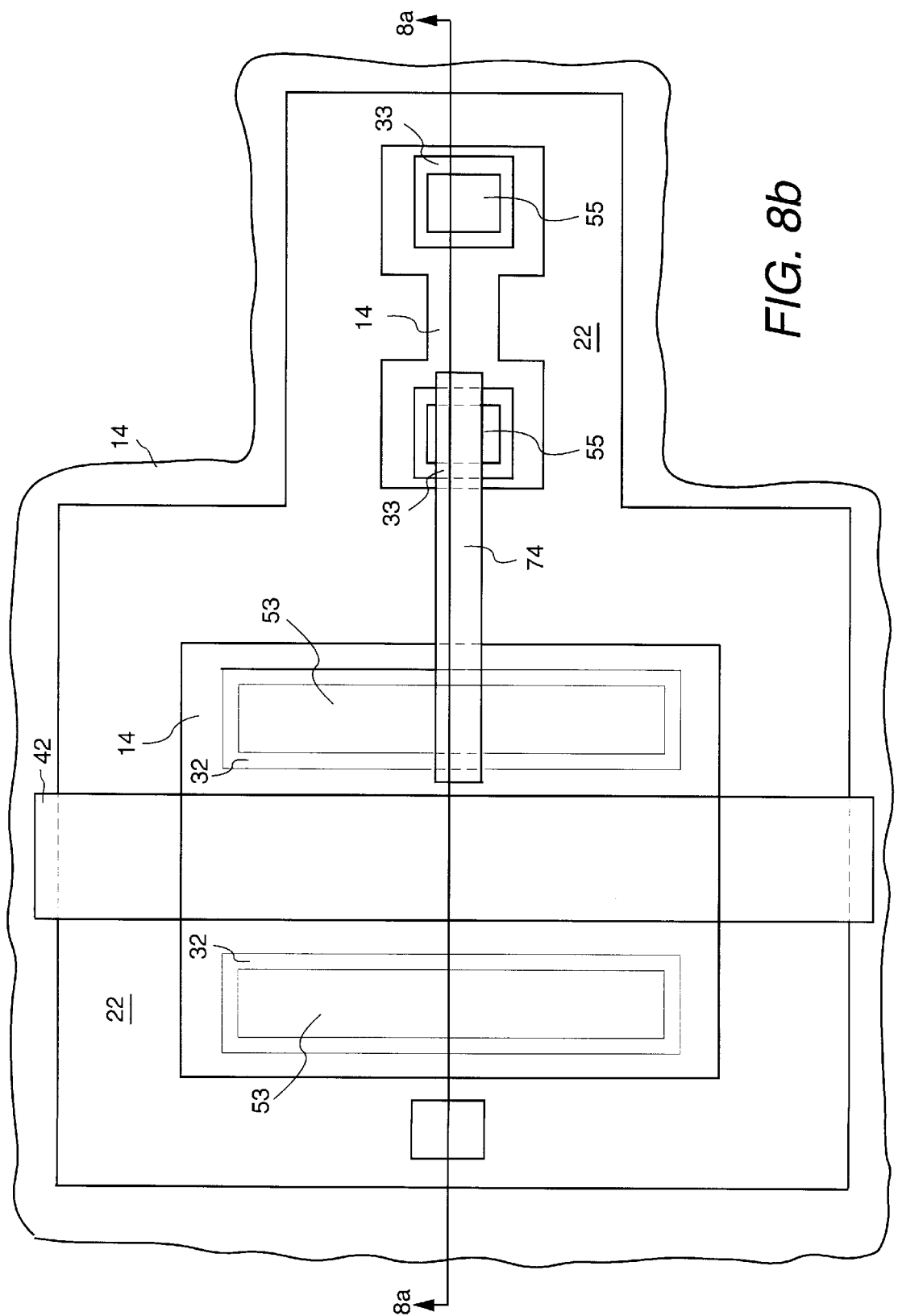
Figure 9A:
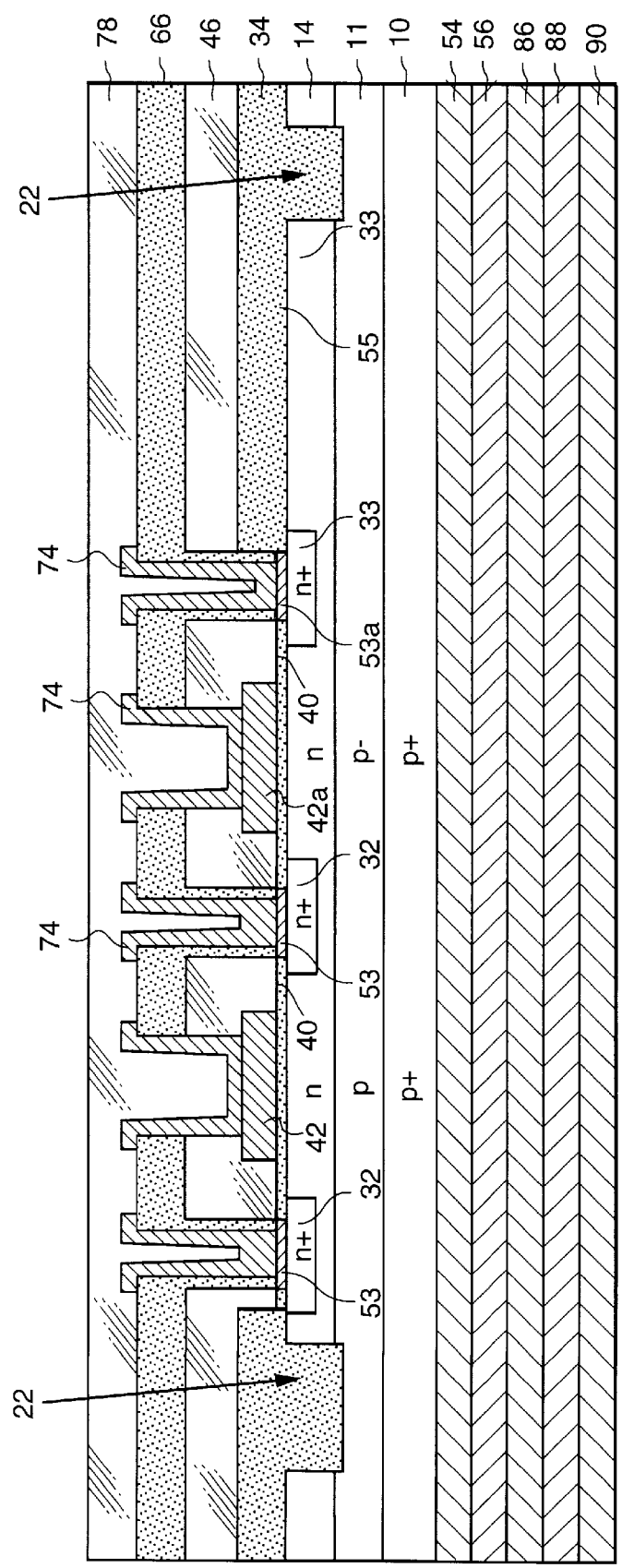

The electrically conductive interconnection material is etched to become the pattern of electrical conductors 74, as shown in FIG. 8a. The pattern is designed to couple one of the resistor electrode contacts 55 with any of the gate electrode 42 and MOSFET electrode contacts 53 (which correspond to source and drain electrode contacts). A passivation layer 78 comprising, for example, a 5000 Å thickness of dielectric material such as phosphosilicate glass is deposited for protecting the surface against mechanical scratches and environmental contamination during handling. Electrically conductive bonding pads 82 are formed by patterning openings in the passivation layer at least partially aligned with a portion of the pattern of electrical conductors with photoresist (not shown) along the chip periphery, sputtering electrically conductive bonding material comprising for example a 3000 Å thick layer of gold, and patterning the bonding material to form one or more bonding pads 82. Then the substrate is metallized with layers comprising materials such as titanium 92, platinum 93, and gold 93. A top view of the structure of FIG. 8a (showing only the portion of the pattern of electrical conductors 74 which couples a MOSFET electrode contact to a resistor electrode contact) is shown in FIG. 8b.

The resistance obtained from n type layer 14 in the region between the resistor electrode n+ type regions 33 is related to the distance between n+ type regions 33 and the width of n type layer 14 as well as the thickness and doping of n type layer 14 and n+ type regions 33. The distance between n+ type regions 33 need not be a straight line distance and can be any appropriate pattern such as serpentine, for example. The n type layer 14 can be patterned to produce resistors with high aspect ratios while minimizing the gain change which Is calculated by the formula:

$$G = G_m \times R,$$

wherein G represents a MOSFET amplifier gain, $G_m$ represents MOSFET transconductance, and R represents the resistance value of a resistor. Nearly constant gain can be achieved by using the facts that MOSFET transconductance decreases with increasing temperature and that the ohmic value of the resistor of the present invention increases with increasing temperature because the epitaxial layer 14 sheet resistance is inversely proportional to charge carrier mobility (as opposed to polysilicon resistance which decreases with increasing temperature) and designing the MOSFET and resistor accordingly.

Respective p and n type layers 11 and 14 require appropriate doping and thicknesses to provide a nearly constant gain and to have a low enough turnoff voltage so as to avoid creation of a surface inversion channel. Furthermore, the p type layer doping must be low enough so that the MOSFET is not cut off by back gate bias effects. In one embodiment, p type layer 11 has a thickness ranging from 4–8 $\mu$m and is epitaxially deposited with a dopant concentration ranging from $1 \times 10^{14}$–$3 \times 10^{15}$ atoms/cm$^3$, n type layer 14 has a thickness ranging from 2500–3500 Å and is epitaxially deposited with a dopant concentration ranging from $3 \times 10^{16}$–$7 \times 10^{16}$ atoms/cm$^3$, and the n+ doped regions have a a thickness ranging from 2000–5000 Å and has ion implanted dopants at a concentration ranging from $1 \times 10^{18}$–$1 \times 10^{20}$ atoms/cm$^3$. Although shown in FIGS. 1a–8b as extending only in n type layer 14, n+ doped regions 32 and 33 can extend through n type layer 14 and into p type layer 11, if desired.

The use of a plurality of oxide layers in FIGS. 1a–8b is only for purposes of example only, one oxide layer between n type layer 14 and gate electrode 42 being all that is required.

When trenches are used for isolation regions 22, these trenches can be left filled with oxide layer 34, as shown in FIG. 8a, or, if preferred, oxide layer 34 (as well as any overlying layers) can be etched to expose at least a portion of the trench.

FIGS. 9a–9b are respective sectional side and top views similar to those of FIGS. 8a–8b wherein the SiC IC includes two MOSFETs having a common source. In this embodiment, n type layer 14 has three n+ type doped regions. Two of the n+ type regions 32 are similar to those discussed with respect to FIGS. 1a–8b, and the third n+ type region 32a is a similar n+ region which, in this embodiment, represents the drain electrode of a second MOSFET. Each of n+ type regions 32 and 32a has a respective electrically conductive electrode contact 53 or 53a positioned over at least a portion of a respective one of the n+ type regions. At least a first portion of thermal oxide layer 40 is positioned between electrode contacts 53 and a second portion of thermal oxide layer 40 is positioned between one of electrode contacts 53 and electrode contact 53a of the second MOSFET. Two gate electrodes 42 and 42a are each positioned over a respective one of the first and second portions of thermal oxide layer 40. Isolation regions 22 are situated beyond the outside boundaries of the two MOSFETs rather than between the MOSFETs.

For illustration, in this embodiment, substrate 10 is of p+ conductivity with a dopant concentration of about $1 \times 10^{18}$–$1 \times 10^{19}$ atoms/cm$^3$ and a thickness of about 250 $\mu$m, for example. When a p+ type substrate is used, substrate contact 51 shown in FIG. 8a is not necessary because the backside of the substrate can be used as a contact. In one embodiment, the backside is coated by sequential sputtering of electrically conductive material to thicknesses such as 1700 Å of aluminum 54 and 600 Å of titanium 56, followed by sintering at 925° C. The backside can additionally be coated with metals such as 1000 Å of titanium 86, 1000 Å of platinum 88, and 1000 Å of gold 90 for a strong bond to the chip package and good electrical contact.

Figure 10:
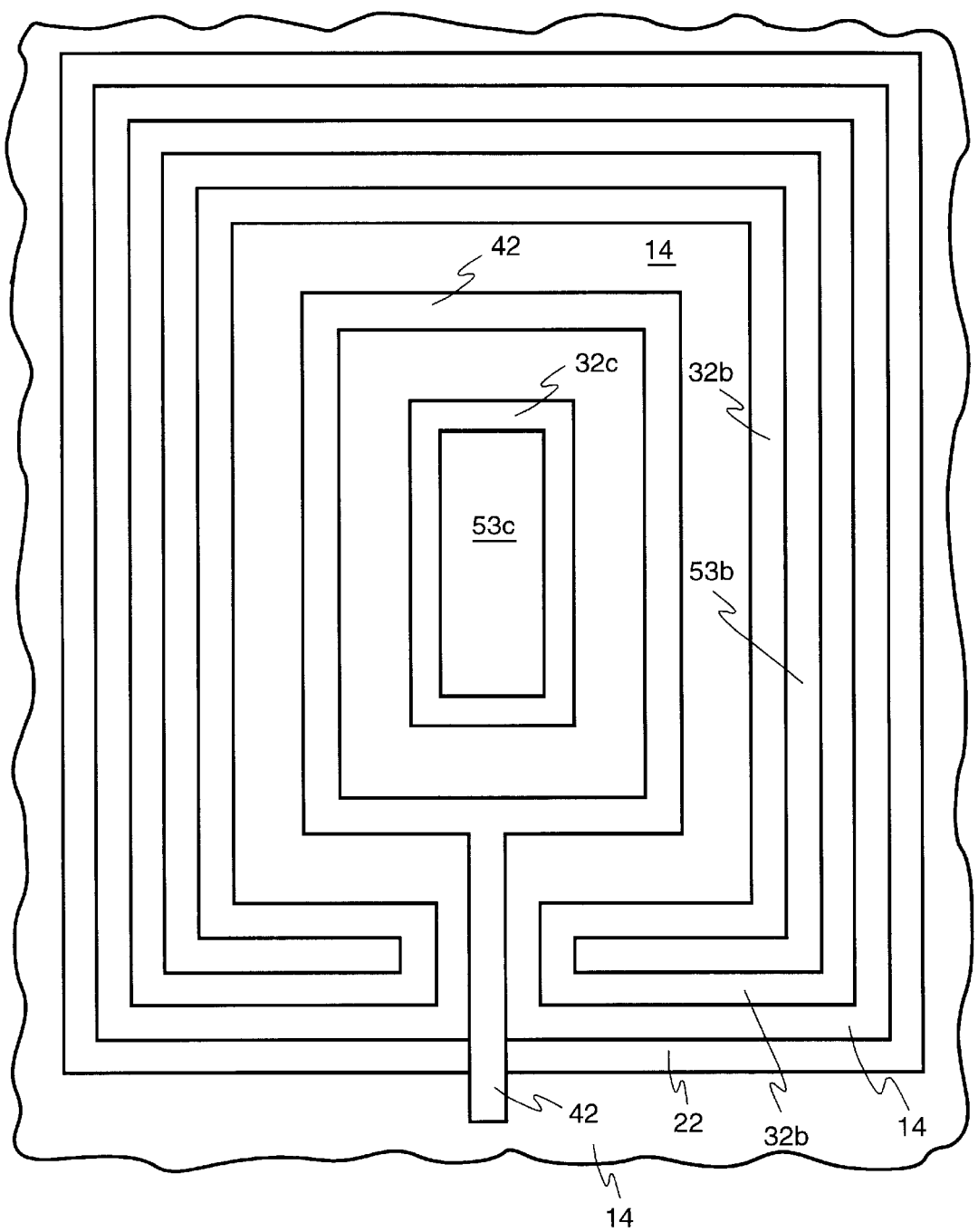
FIG. 10 is a top view of an annular MOSFET which can be used in the present invention.

FIG. 10 is a top view of an annular geometry MOSFET which can be used in the present invention. In FIG. 10, one of the MOSFET electrodes 32b is surrounding the other of the MOSFET electrodes 32c, with gate electrode 42 situated over a portion of oxide layer 34 (not shown) in an annular shape between the respective MOSFET source and drain electrodes 32b and 32c.

Figure 11A:
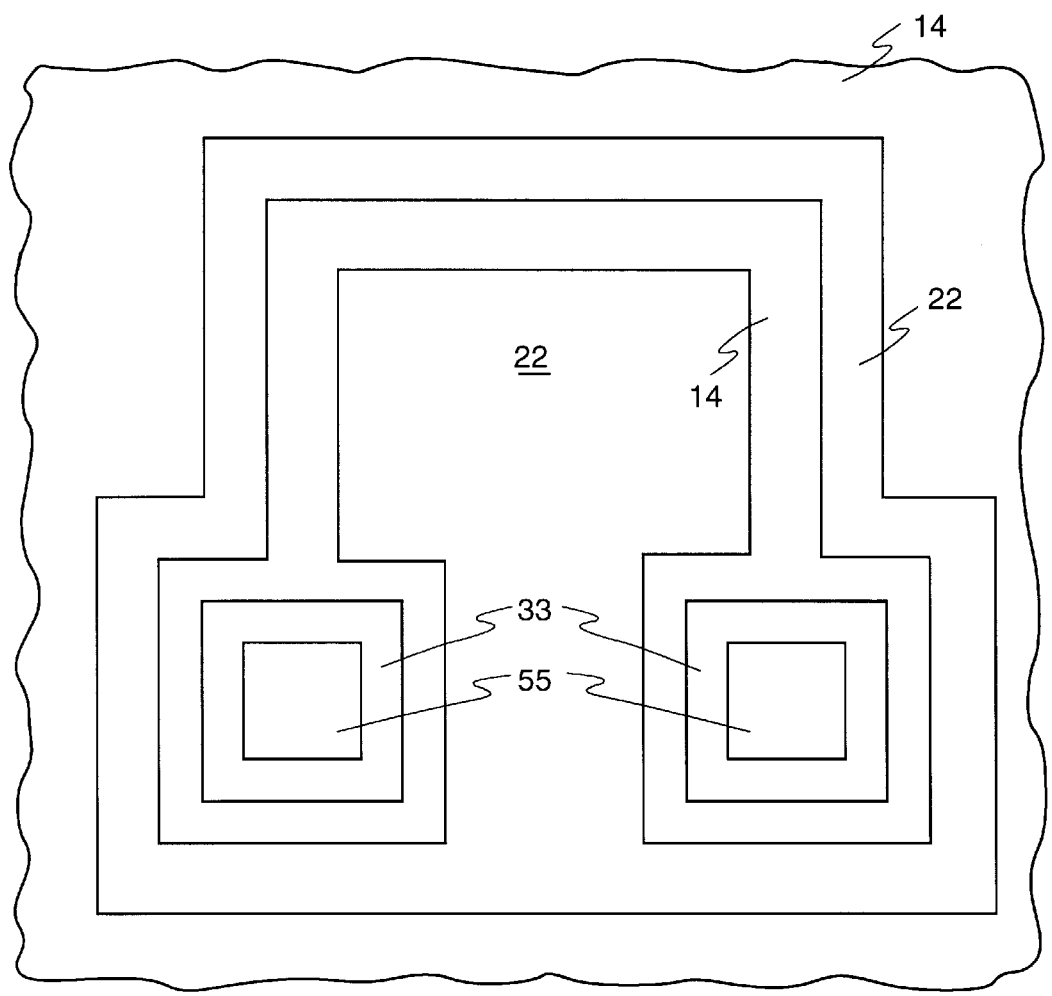
FIGS. 11a–11b are top views of resistor geometries which can be used in the present invention.
Figure 11B:
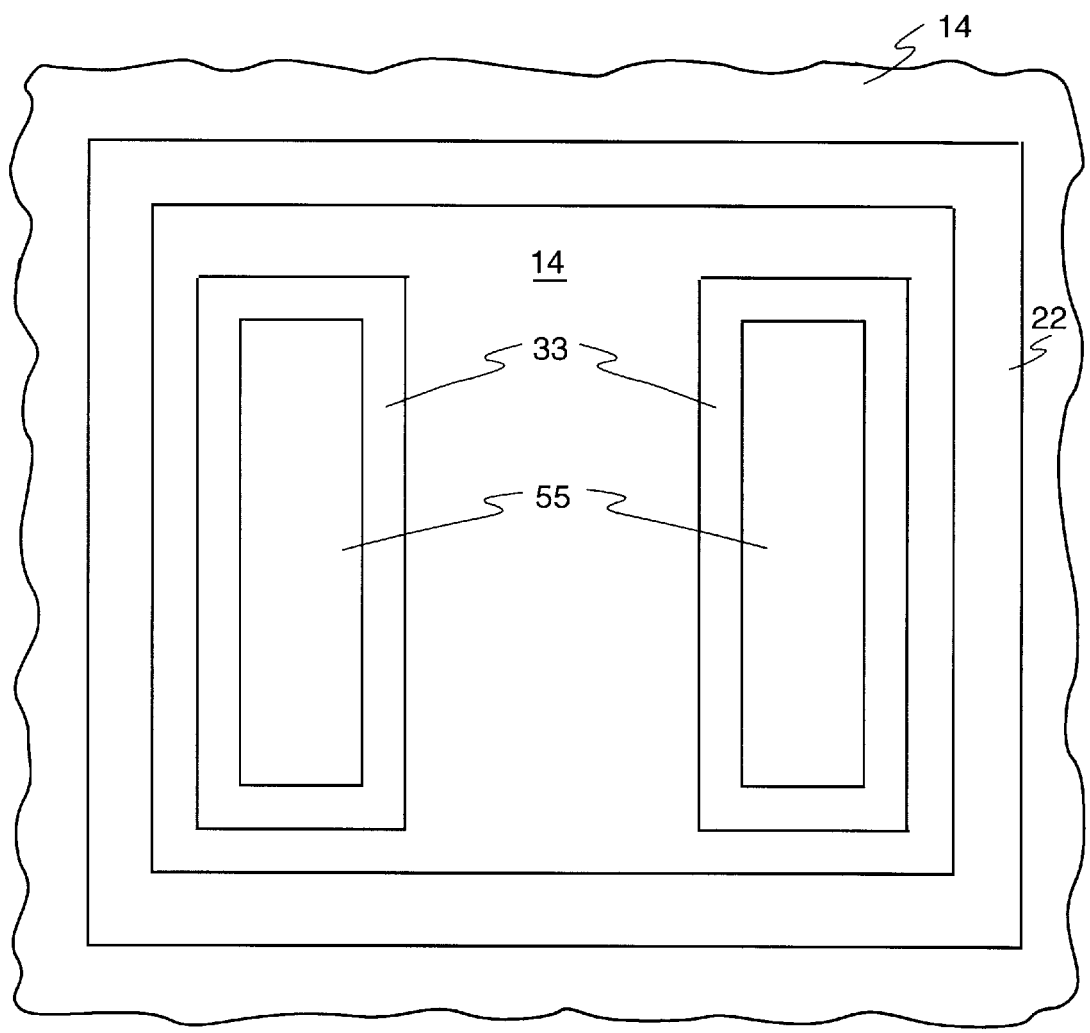

FIGS. 11a–11b are top views of resistor geometries which can be used in the present invention. In FIG. 11a, isolation region 22 is shown patterned so as to increase the distance (and thus the resistance) between resistor electrodes 33 and still keep the surface area of the device relatively compact. As shown in FIG. 11b, two wider resistor electrodes 33 are used to provide a resistance value with less impedance than that of the resistor geometry shown in FIG. 8b.

Figure 12:
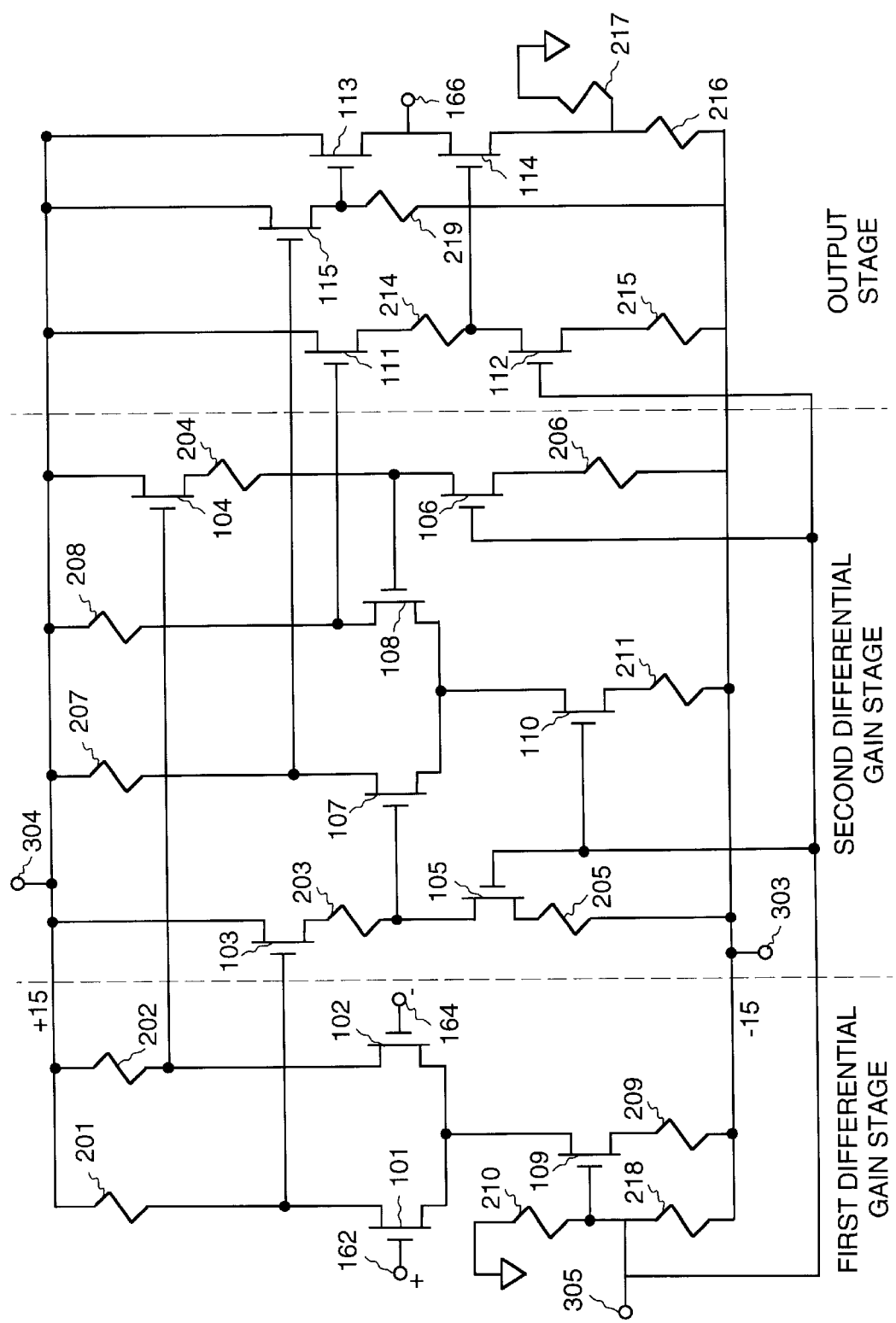
FIG. 12 is a circuit diagram of an operational amplifier capable of fabrication as a SiC IC in accordance with the invention.

FIG. 12 is a circuit diagram of an operational amplifier capable of fabrication as a SiC IC. A monolithic operational amplifier was designed for implementation in 6H-SiC. The devices were fabricated with a 0.26 micron thickness n type layer 14 (shown in FIG. 1*a*) epitaxially deposited and doped at concentration of $5 \times 10^{16}$ atoms/cm$^3$ on a 5 micron thickness p type layer 11 (shown in FIG. 1*a*) epitaxially deposited and doped at a dopant concentration of $1 \times 10^{15}$ atoms/cm$^3$ on a 250 micron thickness p+ type substrate having a dopant concentration of $1 \times 10^{18}$ atoms/cm$^3$.

Each of the combinations of a MOSFET 109 and a resistor 209; a MOSFET 105 and a resistor 205; a MOSFET 110 and a resistor 211; a MOSFET 106 and a resistor 206; and a MOSFET 112 and a resistor 215 is coupled to a negative voltage supply 303, which in one embodiment supplies −15 volts, and acts as a current source for a respective load.

In the first differential gain stage, a MOSFET 101 has a gate coupled to a positive input terminal 162, a drain coupled to the gate of a MOSFET 103 and to a positive voltage supply 304 (comprising a +15 volt supply in one embodiment) through a resistor 201, and a source coupled to the source of a MOSFET 102 and the drain of MOSFET 109. MOSFET 102 further has a drain coupled to the gate of a MOSFET 104 and to the positive supply through a resistor 202 and a gate coupled to a negative input terminal 164. MOSFET 109 further has a source coupled to the negative supply through resistor 209 and a gate coupled to ground through a resistor 210, to the negative supply through a resistor 218 and to the gates of MOSFETs 105, 110, 106, and 112 (if desired, an input/output terminal 305 can be coupled to the gates for measuring the voltage and making any necessary adjustments). Constant current bias is drawn by MOSFET 109 with a constant gate bias voltage set by the ratio of resistor 210 to resistor 218, and the drain voltage bias set by the ratio of the parallel combination of resistors 201 and 202 to resistor 209. MOSFETs 101 and 102 are substantially the same and have a width/length ratio (W/L) of 704 $\mu$m/5 $\mu$m and operate at a drain current of about 10 $\mu$amps. Resistors 201 and 202 are designed to be about 800K ohms. The gain of this stage is expected to be about 39.

For voltage translation, MOSFET 103 further has a drain coupled to the positive supply and a source coupled through a resistor 203 to both the gate of a MOSFET 107 and the drain of MOSFET 105. MOSFET 105 further has a source coupled to the negative supply through resistor 205. MOSFET 104 further has a drain coupled to the positive supply and a source coupled through a resistor 204 to both the gate of a MOSFET 108 and the drain of MOSFET 106. MOSFET 106 further has a source coupled to the negative supply through resistor 206.

The DC voltage level at the output of the first differential gain stage (about +6) must be translated to a negative voltage level (about −8) with little attenuation, to drive a second differential gain stage. MOSFET 103 acts as a source follower which drives resistor 203 which acts as a voltage drop resistor and has a constant current flowing through it to provide the needed voltage translation. The constant current is supplied by MOSFET. 105 and resistor 205, which have an output impedance much larger than the impedance of resistor 203 to minimize signal attenuation. MOSFET 104 similarly drives resistor 204 which has a constant current supplied by MOSFET 106 and resistor 206 (which have an output impedance much larger than the impedance of resistor 204).

In the second differential gain stage, MOSFET 107 further has a drain coupled to the gate of a MOSFET 115 and to the positive supply through a resistor 207 and a source coupled to the source of MOSFET 108 and the drain of MOSFET 110. MOSFET 108 further has a drain coupled to the gate of a MOSFET 111 and to the positive voltage supply through a resistor 208. MOSFET 110 further has a source coupled to the negative voltage supply through resistor 211. Constant current bias is drawn by MOSFET 110 and resistor 211 with a constant gate bias voltage set by the ratio of resistor 210 to resistor 218, and the drain voltage bias set by the ratio of the parallel combination of resistors 207 and 208 to resistor 211. MOSFETs 107 and 108 are substantially identical devices and have a W/L of 148 $\mu$m/5 $\mu$m and operate at a drain current of 10 $\mu$amps. Resistors 207 and 208 are 1 megohm nominal. The gain of this stage is expected to be about 50.

In the output stage, MOSFET 115 further has a drain coupled to the positive supply and a source coupled to the gate of a MOSFET 113 and to the negative supply through a resistor 219. MOSFET 111 further has a drain coupled to the positive supply and a source coupled through a resistor 214 to both the drain of MOSFET 112 and the gate of a MOSFET 114. MOSFET 112 further has a source coupled to the negative supply through a resistor 215. MOSFET 114 has a drain coupled to the source of MOSFET 113 and to an output terminal 166 and a source coupled to ground through resistor 217 and to the negative supply through a resistor 216. MOSFET 113 has a drain coupled to the positive supply.

The non-inverting output of the second differential gain stage drives MOSFETs 115 and 113, which act as cascaded source followers, to provide positive output current. MOSFETs 111 and 112 act as a voltage translator to convert the output voltage from the drain of MOSFET 108 (a positive value) into a negative voltage value to drive MOSFET 114, thus providing negative output current. MOSFET 111 acts as a source follower which drives resistor 214 which acts as a voltage drop resistor and has a constant current flowing through it to provide the needed voltage translation. The constant current is supplied by MOSFET 212 and resistor 215, which have an output impedance much larger than the impedance of resistor 214 to minimize signal attenuation.

An external resistor-capacitor series compensation network (not shown) can be connected between the drains of MOSFETs 101 and 102 to control the phase shift of the output with respect to the input for amplifier stability.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A silicon carbide (SiC) integrated circuit (IC) including a depletion mode MOSFET and a resistor, comprising:

a first layer comprising SiC material doped to a first conductivity type, the first conductivity type being p type conductivity;

a second layer overlaid on the first SiC layer and comprising SiC material doped to a second conductivity type, the second conductivity type being n type conductivity, the second SiC layer including at least four more heavily doped ion-implanted regions of said second conductivity type, two of said more heavily doped regions comprising MOSFET electrodes and two others of said more heavily doped regions comprising resistor electrodes, said second SiC layer including an isolation region between said MOSFET electrodes and said resistor electrodes;

an oxide layer situated over said second SiC layer, at least a portion of said oxide layer being positioned over a portion of said second SiC layer between said MOSFET electrodes, one of said MOSFET electrodes comprising a source electrode and the other of said MOSFET electrodes comprising a drain electrode;

a MOSFET gate electrode positioned over said portion of said oxide layer between said MOSFET source and drain electrodes and comprising an electrically conductive material; and coupling means for forming electrically conductive source, drain, and resistor electrode contacts over said source, drain, and resistor electrodes respectively, and for electrically coupling one of said source electrode contact, said drain electrode contact, and said gate electrode to one of said resistor electrode contacts.

2. The SiC IC of claim 1, wherein said first SiC layer is doped at a concentration ranging from $1 \times 10^{14}$ to $3 \times 10^{15}$ atoms/cm$^3$, said second SiC layer is doped at a concentration ranging from $3 \times 10^{16}$ to $7 \times 10^{16}$ atoms/cm$^3$.

3. The SiC IC of claim 1, wherein said oxide layer over said second SiC layer substantially covers said second SiC layer and has openings at least partially aligned with said source, drain, and resistor electrode contacts, and wherein said coupling means further includes a pattern of electrical conductors extending over said oxide layer and into said openings.

4. The SiC IC of claim 1, wherein said isolation region comprises a trench through said second SiC layer separating said two MOSFET electrodes from said two resistor electrodes.

5. The SiC IC of claim 4, further including an electrically conductive substrate contact positioned in said trench;

wherein said oxide layer over said second SiC layer substantially covers said second SiC layer and has contact openings at least partially aligned with said source, drain, and resistor electrode contacts, and said substrate contact;

and further including
a dielectric layer over said oxide layer;
an additional oxide layer over said dielectric layer, said dielectric and additional oxide layers having interconnection openings therein at least partially aligned with said gate electrode and said contact openings; and wherein said coupling means further includes a pattern of electrical conductors extending over said additional oxide layer, said dielectric layer, and said oxide layer and into said interconnection openings.

6. The SiC IC of claim 5, further including an n type SiC substrate supporting said first SiC layer.

7. The SiC IC of claim 5, further including a passivation layer over said pattern of electrical conductors and said additional oxide layer, said passivation layer having a bonding opening therein at least partially aligned with a portion of said pattern of electrical conductors coupled to said substrate contact, and an electrically conductive bonding pad extending through said bonding opening to contact said pattern of electrical conductors.

8. The SiC IC of claim 1, further including a p type SiC substrate supporting said first SiC layer.

9. The SiC IC of claim 8, further including a metallic layer on a surface of said substrate facing away from said first SiC layer.

10. The SiC IC of claim 1, wherein said isolation region comprises a semiconductor region doped to the first conductivity type and extending through said second SiC layer separating said two MOSFET electrodes from said two resistor electrodes.

11. A silicon carbide (SiC) integrated circuit (IC) element including two depletion mode MOSFETs, comprising:

a first SiC layer doped to a first conductivity type, the first conductivity type being p type conductivity;

a second SiC layer overlaid on said first SiC layer and doped to a second conductivity type, the second conductivity type being n type conductivity, said second SiC layer including at least three more heavily doped ion-implanted regions of said second conductivity type;

three electrically conductive contacts, each of said contacts being positioned over at least a portion of a respective one of said more heavily doped regions;

an oxide layer situated over said second SiC layer such that at least a first portion of said oxide layer is positioned between a first pair of said contacts and at least a second portion of said oxide layer is positioned between a second pair of said contacts, said first and second pairs of contacts having one common contact; and two electrodes, each of said electrodes being positioned over a respective one of said first and second portions of said oxide layer.

12. The SiC IC element of claim 11, wherein said first SiC layer is doped at a concentration ranging from $1 \times 10^{14}$ to $3 \times 10^{15}$ atoms/cm$^3$ and has a thickness ranging from 4–8 $\mu$m, and said second SiC layer is doped at a concentration ranging from $3 \times 10^{16}$ to $7 \times 10^{16}$ atoms/cm$^3$ and has a thickness ranging from 2500–3500 Å.

13. The SiC IC element of claim 11, wherein said oxide layer over said second SiC layer substantially covers said second SiC layer and has openings at least partially aligned with said contacts, and wherein said coupling means comprises a pattern of electrical conductors extending over said oxide layer and into said openings.

14. The SiC IC element of claim 11, wherein said second SiC layer includes an isolation region surrounding said at least three more heavily doped regions.

15. The SiC IC element of claim 14, wherein said isolation region comprises a trench through said second SiC layer.

16. The SiC IC element of claim 15, further including an electrically conductive substrate contact positioned in said trench;

wherein said oxide layer over said second SiC layer substantially covers said second SiC layer and has contact openings at least partially aligned with said contacts and said substrate contact;

and further including
a dielectric layer over said oxide layer;
an additional oxide layer over said dielectric layer, said dielectric and additional oxide layers having interconnection openings therein at least partially aligned with said gate electrode and said contact openings; and a pattern of electrical conductors extending over said additional oxide layer, said dielectric layer, and said oxide layer and into said interconnection openings for coupling said SiC IC element with an additional SiC IC element.

17. An SiC IC including a depletion mode MOSFET and a resistor and fabricated by a method comprising the steps of:

providing a first layer comprising SiC doped to p type conductivity;

applying a second layer comprising SiC doped to n type conductivity over the first SiC layer;

forming at least four more heavily doped ion-implanted regions of n type conductivity in the second SiC layer, two of said more heavily doped regions comprising resistor electrodes and two others of said more heavily doped regions comprising MOSFET electrodes, one of said MOSFET electrodes comprising a source electrode and the other of said MOSFET electrodes comprising a drain electrode;

forming an isolation region in said second SiC layer between said MOSFET electrodes and said resistor electrodes;

applying an oxide layer over said second SiC layer, at least a portion of said oxide layer being positioned over a portion of said second SiC layer that is between said MOSFET electrodes;

positioning a gate electrode over said oxide layer;

applying two electrically conductive MOSFET electrode contacts, each MOSFET electrode contact positioned over at least a portion of a respective MOSFET electrode, applying two electrically conductive resistor electrode contacts, each resistor electrode contact positioned over at least a portion of a respective resistor electrode; and electrically coupling one of said source, drain, and gate contacts to one of said resistor contacts.

* * * * *